(12) United States Patent
Govorkov et al.

(10) Patent No.: US 6,463,084 B1
(45) Date of Patent: Oct. 8, 2002

(54) DEVICE FOR ON-LINE CONTROL OF OUTPUT POWER OF VACUUM-UV LASER

(75) Inventors: Sergei V. Govorkov, Boca Raton, FL (US); Gongxue Hua, Fort Lauderdale, FL (US)

(73) Assignee: Lambda Physik AG, Goettingen (DE)

( * ) Notice: Subject to any disclaimer, the term of this patent is extended or adjusted under 35 U.S.C. 154(b) by 0 days.

(21) Appl. No.: 09/971,796

(22) Filed: Oct. 3, 2001

Related U.S. Application Data (60) Division of application No. 09/598,522, filed on Jun. 21, 2000, which is a continuation-in-part of application No. 09/343,333, filed on Jun. 30, 1999, now Pat. No. 6,219,368.
(60) Provisional application No. 60/140,530, filed on Jun. 23, 1999, and provisional application No. 60/119,973, filed on Feb. 12, 1999.

(51) Int. Cl.[7] .................................................. H01S 3/10
(52) U.S. Cl. ............................ 372/9; 372/58; 372/57; 372/98
(58) Field of Search ............................... 372/98, 92, 58, 372/9, 57, 29.02, 55

(56) References Cited

U.S. PATENT DOCUMENTS

| 4,393,505 A | * | 7/1983 | Fahlen ........................... 372/57 |
| 4,616,908 A | | 10/1986 | King ............................ 350/576 |
| 3,719,641 A | * | 1/1988 | Muller et al. ................. 372/55 |

(List continued on next page.)

FOREIGN PATENT DOCUMENTS

| EP | 0 790 681 A2 | 8/1997 | ............ H01S/3/134 |
| EP | 1 017 086 A1 | 7/2000 | ............ H01L/21/057 |
| JP | 408055792 A | 2/1996 | ............ H01L/21/027 |
| WO | WO 98/57213 | 12/1998 | ............ G02B/27/00 |
| WO | WO 98/59364 | 12/1998 | ............ H01L/21/027 |
| WO | WO 99/04467 | 1/1999 | ............ H01S/3/134 |
| WO | WO 99/08133 | 2/1999 | ............ G03B/27/42 |

OTHER PUBLICATIONS

James K. Rick, et al., "Oscillator Performance and Energy Extraction from a KrF Laser Pumped by a High–Intensity Relativistic Electron Beam," *IEEEE Journal of Quantum Electronics*, vol. QE–16, No. 12, Dec. 1980.

McKee, T., "Spectral–narrowing Techniques for Excimer Laser Oscillators," *Can. J. Phys.*, vol. 63, 1985, pp. 214–219.

Ishchenko, V. N., et al., "High–power Efficient Vaccuum Ultraviolet F2 Laser Excited by an Electric Discharge," *Sov. J. Quantum Electron*, 16(5), May 1986, pp. 707–709.

(List continued on next page.)

*Primary Examiner*—Leon Scott, Jr.
(74) *Attorney, Agent, or Firm*—Sierra Patent Group, Ltd.; Andrew V. Smith (57) ABSTRACT

A beam delivery system for a laser emitting at a relevant wavelength of less than 200 nm is provided. The system includes a sealed enclosure connected to the laser and surrounding the path of the beam as it exits the laser resonator. The enclosure extends between the laser output coupler and a photodetector sensitive at the wavelength of the relevant laser emission. The interior of the enclosure, and thus the beam path between the output coupler and the detector, is substantially free of species that strongly photoabsorb radiation at the relevant laser emission wavelength. A beam splitting element diverts at least a portion of the beam for measurement by the detector. The beam splitting element preferably includes a beam splitting mirror, holographic beam sampler or diffraction grating. In addition, optics are preferably provided for filtering a visible portion of the diverted beam, so that substantially only a VUV portion of the diverted beam is received at the detector. The filtering optics preferably include a diffraction grating, holographic beam sampler or one or more dichroic mirrors.

15 Claims, 4 Drawing Sheets

U.S. PATENT DOCUMENTS

| | | | |
|---|---|---|---|
| 5,051,558 A | 9/1991 | Sukhman | 219/121.68 |
| 5,221,823 A | 6/1993 | Usui | 219/121.78 |
| 5,440,587 A | 8/1995 | Ishikawa et al. | 375/332 |
| 5,450,436 A * | 9/1995 | Mizoguchi et al. | 372/59 |
| 5,559,584 A | 9/1996 | Miyaji et al. | 355/73 |
| 5,590,146 A | 12/1996 | von Borstel | 372/58 |
| 5,763,855 A | 6/1998 | Shioji | 219/121.84 |
| 5,811,753 A | 9/1998 | Weick et al. | 219/121.78 |
| 6,219,368 B1 * | 4/2001 | Govorkov | 372/59 |
| 6,298,080 B1 * | 10/2001 | Heist et al. | 372/57 |
| 6,345,065 B1 * | 2/2002 | Kleinschmidt et al. | 372/57 |

OTHER PUBLICATIONS

S.M. Hooker et al., "Influence of Cavity Configuration on the Pulse Energy of a High–Pressure Molecular Fluorine Laser," *Applied Physics B Photo–Physics and Laser Chemistry*, vol. B55, No. 1., Jul. 1992, pp. 55–59.

J.A.R. Samson, "Techniques of Vacuum Ultraviolet Spectroscopy," John Wiley & Sons, New York.

H. Schomalenstroth et al., "Untersuchungen zum Laserstrahlschweissen mit 1–wk–nd:YAG–Laser unter Einsatz verschiedener Schutzgasgemische," *Schweissen& Schneiden*, 49 (1997) Heft 7, pp. 420–424.

* cited by examiner

Output power of the laser stablizied by using an energy monitor in a feedback arrangement with inert gas purging (plot 1), and with an evacuated housing (plot 2).

Alternative configuration of beam splitters in the first embodiment

FIG. 7b

Alternative configuration of beam splitters in the third embodiment

DEVICE FOR ON-LINE CONTROL OF OUTPUT POWER OF VACUUM-UV LASER

PRIORITY

This application is a divisional application filed under 37 C.F.R. 1.53(b) which claims the benefit of priority to U.S. patent application Ser. No. 09/598,522, filed Jun. 21, 2000, which claims the benefit of priority to U.S. provisional patent application No. 60/140,530, filed Jun. 23, 1999, which is hereby incorporated by reference, and which is also a Continuation-in-Part of United States patent application No. 09/343,333, filed Jun. 30, 1999, now U.S. Pat. No. 6,219,368, which claims the benefit of priority to U.S. provisional patent application No. 60/119,973, filed Feb. 12, 1999.

BACKGROUND OF THE INVENTION

1. Field of the Invention

The invention relates to on-line control of the output power of a molecular fluorine laser beam, and particularly to a technique for redirecting VUV light of the beam to a VUV detector, while filtering visible light from the redirected beam.

2. Discussion of the Related Art

The molecular fluorine laser emitting at 157 nm has an advantageously short wavelength, or high photon energy. Because of this, very small structures, such as sub-0.18 micron structures and even sub-0.10 micron structures, may be formed by photolithographic exposure on semiconductor substrates. TFT annealing and micro-machining applications may also be performed advantageously at this wavelength.

For the applications mentioned above, on-line monitoring and control of the output power of the laser may be advantageously performed such that the energy stability of the output beam and overall performance of the laser may be enhanced. For this purpose, an energy or power detector may be configured to receive a split off portion of the output beam. The input voltage and other conditions such as the gas mixture composition may be actively adjusted depending on the measured pulse energy, energy dose or moving average energy in order to provide high stability.

There are several factors inhibiting use of conventional light detectors for on-line monitoring of VUV laser output. First, laser radiation below 200 nm is strongly absorbed in the atmosphere, e.g., by water vapor, oxygen, hydrocarbons, and fluorocarbons. Specifically, at 157 nm, the extinction length of a molecular fluorine laser beam is around 1 mm or less in ambient air due mostly to the presence of oxygen and water vapor in the air. Second, contaminants such as oil vapors and other organic substances generated, for instance, by vacuum pumps and plastic enclosures tend to form films on optical surfaces causing strong absorption. Third, the molecular fluorine laser generates, in addition to 157 nm light, radiation in the red part of the visible spectrum, between 600 and 800 nm, due to emission by excited atomic fluorine species in the laser gas mixture. This red emission is sensed by most optical detectors whose sensitivity tends to be higher in the visible part of the spectrum, as compared to that in the VUV range, i.e., at 157 nm.

SUMMARY OF THE INVENTION

It is therefore an object of the invention to provide a method and apparatus for detecting output power of a molecular fluorine laser beam without the beam being substantially absorbed as it propagates to the detector.

It is a further object of the invention to provide a method and apparatus for detecting the VUV output of a molecular fluorine laser while any accompanying visible output of the laser is substantially suppressed before reaching the detector.

In accord with the above objects, a beam delivery system for a laser emitting at a relevant wavelength of less than 200 nm is provided. The system includes a sealed enclosure surrounding the path of the beam as it exits the laser resonator. The enclosure extends between the laser output coupler and a photodetector sensitive at the wavelength of the relevant laser emission. The interior of the enclosure, and thus the beam path between the output coupler and the detector, is substantially free of species that strongly photoabsorb radiation at the relevant laser emission wavelength. A beam splitting element diverts at least a portion of the beam for measurement by the detector.

The beam splitting element preferably includes a beam splitting mirror, holographic beam sampler or diffraction grating. In addition, optics are preferably provided for filtering a visible portion of the diverted beam, so that substantially only a VUV portion of the diverted beam is received at the detector. The filtering optics preferably include a diffraction grating, holographic beam sampler or dichroic mirrors.

DESCRIPTION OF THE PREFERRED EMBODIMENTS

The preferred embodiments described below provide means of on-line monitoring of the output power of a vacuum UV laser, specifically a molecular fluorine laser, operating in a wavelength range below 200 nm. Preferred and alternative embodiments described below further provide means of minimizing variations of sensitivity of VUV laser energy monitor due to absorption, as well as suppressing a visible red portion of the output. The former is generally achieved by providing a hermetic enclosure which is preferably purged with an inert gas. The latter is preferably provided by one of three techniques including the use of a diffraction grating, a dichroic thin-film dielectric mirror arrangement, or a holographic beam sampler.

Figure 1:
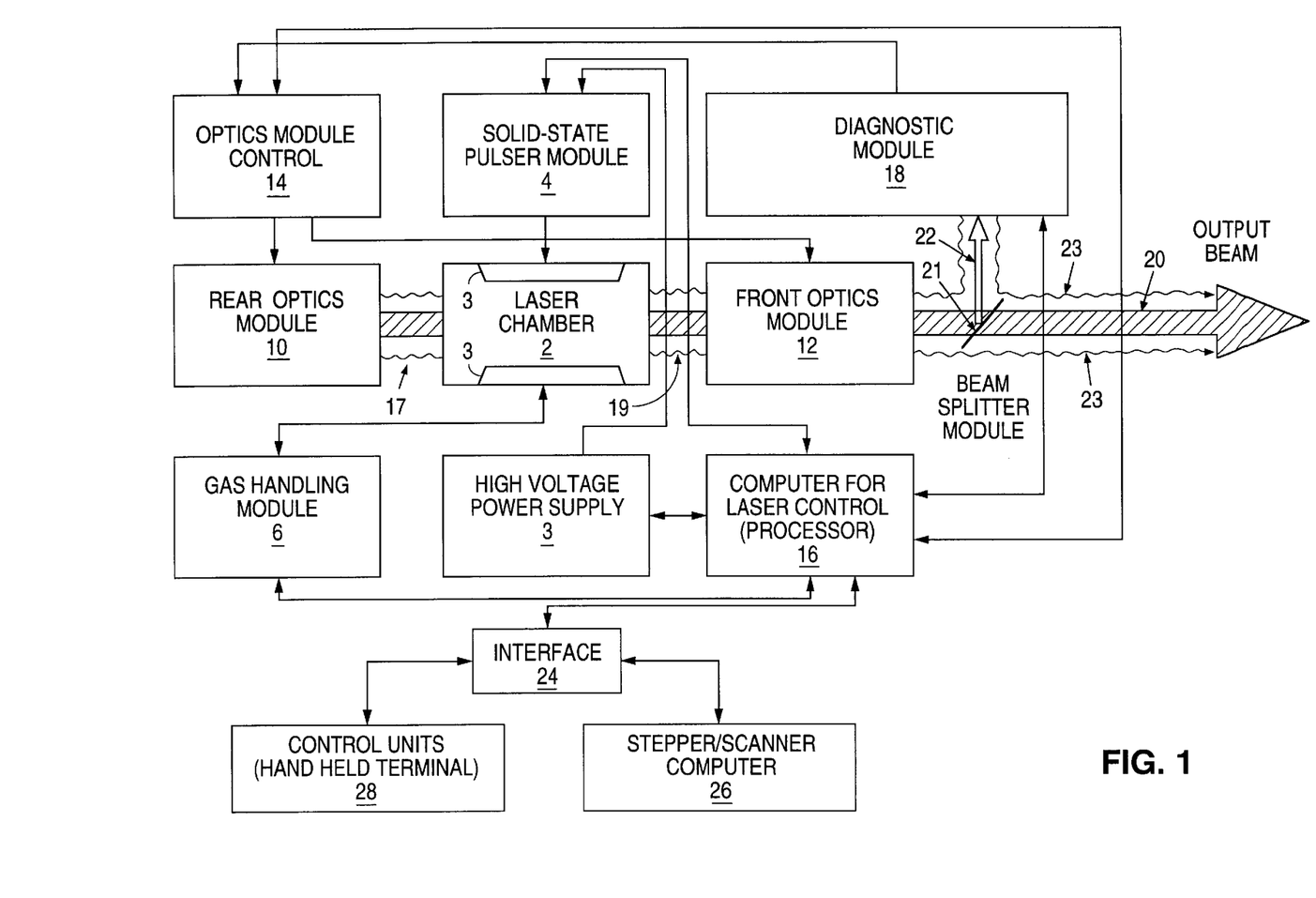
FIG. 1 schematically illustrates a molecular fluorine laser system in accord with a preferred embodiment.

Referring to FIG. 1, a VUV laser system, preferably a molecular fluorine laser for deep ultraviolet (DUV) or vacuum ultraviolet (VUV) lithography, is schematically shown. Alternative configurations for laser systems for use in such other industrial applications as TFT annealing and/or micromachining, e.g., are understood by one skilled in the art as being modified from the system shown in FIG. 1 to meet the requirements of that application. For this purpose, alternative VUV laser system and component configurations are described at U.S. patent application Ser. Nos. 09/317,695, 09/317,526, 09/317,527, 09/343,333, 60/122,145, 60/140,531, 60/162,735, 60/166,952, 60/171,172, 60/141,678, 60/173,993, 60/166,967, 60/172,674, and 60/181,156, and U.S. patent application of Kleinschmidt, serial number not yet assigned, filed May 18, 2000, for "Reduction of Laser Speckle in Photolithography by Controlled Disruption of Spatial Coherence of Laser Beam," and U.S. Pat. No. 6,005,880, each of which is assigned to the same assignee as the present application and is hereby incorporated by reference.

The system shown in FIG. 1 generally includes a laser chamber 2 having a pair of main discharge electrodes 3 connected with a solid-state pulser module 4, and a gas handling module 6. The solid-state pulser module 4 is powered by a high voltage power supply 8. The laser chamber 2 is surrounded by optics module 10 and optics module 12, forming a resonator. The optics modules 10 and 12 are controlled by an optics control module 14.

A computer 16 for laser control receives various inputs and controls various operating parameters of the system. A diagnostic module 18 receives and measures various parameters of a split off portion of the main beam 20 via optics for deflecting a small portion of the beam toward the module 18, such as preferably a beam splitter module 21, as shown. The beam 20 is preferably the laser output to an imaging system (not shown) and ultimately to a workpiece (also not shown). The laser control computer 16 communicates through an interface 24 with a stepper/scanner computer 26 and other control units 28.

The laser chamber 2 contains a laser gas mixture and includes a pair of main discharge electrodes and one or more preionization electrodes (not shown). Preferred main electrodes 3 are described at U.S. patent applications Ser. Nos. 09/453,670, 60/184,705 and 60/128,227, each of which is assigned to the same assignee as the present application and is hereby incorporated by reference. Other electrode configurations are set forth at U.S. Pat. Nos. 5,729,565 and 4,860,300, each of which is assigned to the same assignee, and alternative embodiments are set forth at U.S. Pat. Nos. 4,691,322, 5,535,233 and 5,557,629, all of which are hereby incorporated by reference. The laser chamber 2 also includes a preionization arrangement (not shown). Preferred preionization units are set forth at U.S. patent application Ser. Nos. 60/162,845, 60/160,182, 60/127,237, 09/535,276 and 09/247,887, each of which is assigned to the same assignee as the present application, and alternative embodiments are set forth at U.S. Pat. Nos. 5,337,330, 5,818,865 and 5,991,324, all of the above preionization units being hereby incorporated by reference.

The solid-state pulser module 14 and high voltage power supply 8 supply electrical energy in compressed electrical pulses to the preionization and main electrodes within the laser chamber 2 to energize the gas mixture. The preferred pulser module and high voltage power supply are described at U.S. patent application Nos. 60/149,392, 60/198,058, and Ser. No. 09/390,146, and U.S. patent application of Osmanow, et al., serial number not yet assigned, filed May 15, 2000, for "Electrical Excitation Circuit for Pulsed Laser", and U.S. Pat. Nos. 6,005,880 and 6,020,723, each of which is assigned to the same assignee as the present application and which is hereby incorporated by reference into the present application. Other alternative pulser modules are described at U.S. Pat. Nos. 5,982,800, 5,982,795, 5,940,421, 5,914,974, 5,949,806, 5,936,988, 6,028,872 and 5,729,562, each of which is hereby incorporated by reference. A conventional pulser module may generate electrical pulses in excess of 3 Joules of electrical power (see the '988 patent, mentioned above).

The laser resonator which surrounds the laser chamber 2 containing the laser gas mixture includes optics module 10 including line-narrowing optics for a line narrowed excimer or molecular fluorine laser, which may be replaced by a high reflectivity mirror or the like if line-narrowing is not desired. Exemplary line-narrowing optics of the optics module 10 include a beam expander, an optional etalon and a diffraction grating, which produces a relatively high degree of dispersion, for a narrow band laser such as is used with a refractive or catadioptric optical lithography imaging system. For a semi-narrow band laser such as is used with an all-reflective imaging system, the grating is replaced with a highly reflective mirror, and a lower degree of dispersion may be produced by a dispersive prism.

The beam expander of the line-narrowing optics of the optics module 10 typically includes one or more prisms. The beam expander may include other beam expanding optics such as a lens assembly or a converging/diverging lens pair. The grating or highly reflective mirror is preferably rotatable so that the wavelengths reflected into the acceptance angle of the resonator can be selected or tuned. The grating is typically used, particularly in KrF and ArF lasers, both for achieving narrow bandwidths and also often for retroreflecting the beam back toward the laser tube. One or more dispersive prisms may also be used, and more than one etalon may be used.

Depending on the type and extent of line-narrowing and/or selection and tuning that is desired, and the particular laser that the line-narrowing optics of the optics module 10 is to be installed into, there are many alternative optical configurations that may be used. For this purpose, those shown in U.S. Pat. Nos. 4,399,540, 4,905,243, 5,226,050, 5,559,816, 5,659,419, 5,663,973, 5,761,236, and 5,946,337, and U.S. patent application Ser. Nos. 09/317,695, 09/130,277, 09/244,554, 09/317,527, 09/073,070, 60/124,241, 60/140,532, 60/147,219 and 60/140,531, 60/147,219, 60/170,342, 60/172,749, 60/178,620, 60/173,993, 60/166,277, 60/166,967, 60/167,835, 60/170,919, 60/186,096, each of which is assigned to the same assignee as the present application, and U.S. Pat. Nos. 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, are each hereby incorporated by reference into the present application.

Optics module 12 preferably includes means for outcoupling the beam 20, such as a partially reflective resonator reflector. The beam 20 may be otherwise outcoupled such as by an intraresonator beam splitter or partially reflecting surface of another optical element, and the optics module 12 would in this case include a highly reflective mirror. The optics control module 14 controls the optics modules 10 and 12 such as by receiving and interpretting signals from the processor 16, and initiating realignment or reconfiguration procedures (see the '241, '695, 277, 554, and 527 applications mentioned above).

The laser chamber 2 is sealed by windows transparent to the wavelengths of the emitted laser radiation 14. The windows may be Brewster windows or may be aligned at another angle to the optical path of the resonating beam. The beam path between the laser chamber and each of the optics modules 10 and 12 is sealed by enclosures 17 and 19, and the interiors of the enclosures is substantially free of water vapor, oxygen, hydrocarbons, fluorocarbons and the like which otherwise strongly absorb VUV laser radiation.

After a portion of the output beam 20 passes the outcoupler of the optics module 12, that output portion impinges upon beam splitter module 21 which includes optics for deflecting a portion of the beam to the diagnostic module 18, or otherwise allowing a small portion of the outcoupled beam to reach the diagnostic module 18, while a main beam portion 20 is allowed to continue as the output beam 20 of the laser system. Preferred optics include a beamsplitter or otherwise partially reflecting surface optic. The optics may also include a mirror or beam splitter as a second reflecting optic. More than one beam splitter and/or HR mirror(s), and/or dichroic mirror(s) may be used to direct portions of the beam to components of the diagnostic module 18. A holographic beam sampler, transmission grating, partially transmissive reflection diffraction grating, grism, prism or other refractive, dispersive and/or transmissive optic or optics may also be used to separate a small beam portion 22 from the main beam 20 for detection at the diagnostic module 18, while allowing most of the main beam 20 to reach an application process directly or via an imaging system or otherwise. The output beam 20 may be transmitted at the beam splitter module while a reflected beam portion 22 is directed at the diagnostic module 18, or the main beam 20 may be reflected, while a small portion 22 is transmitted to the diagnostic module 18. The portion of the outcoupled beam which continues past the beam splitter module 21 is the output beam 20 of the laser, which propagates toward an industrial or experimental application such as an imaging system and workpiece for photolithographic applications.

An enclosure 23 seals the beam path of the beams 22 and 20 such as to keep the beam paths free of photoabsorbing species. The enclosure 23 and beam splitting module 21 will be described in more detail below with respect to FIGS. 2–7. For example, the beam splitting module 21 preferably also includes optics for filtering visible red light from the beam 22 so that substantially only VUV light is received at a detector of the diagnostic module 18. Also, an inert gas purge is preferably flowing through the enclosure 23.

The diagnostic module 18 preferably includes at least one energy detector. This detector measures the total energy of the beam portion that corresponds directly to the energy of the output beam 20. An optical configuration such as an optical attenuator, e.g., a plate or a coating, or other optics may be formed on or near the detector or beam splitter module 21 to control the intensity, spectral distribution and/or other parameters of the radiation impinging upon the detector (see U.S. patent application Ser. Nos. 09/172,805, 60/172,749, 60/166,952 and 60/178,620, each of which is assigned to the same assignee as the present application and is hereby incorporated by reference).

One other component of the diagnostic module 18 is preferably a wavelength and/or bandwidth detection component such as a monitor etalon or grating spectrometer (see U.S. patent application Ser. Nos. 09/416,344, 60/186,003, 60/158,808, and 60/186,096, and Lokai, et al., serial number not yet assigned, "Absolute Wavelength Calibration of Lithography Laser Using Multiple Element or Tandem See Through Hollow Cathode Lamp", filed May 10, 2000, each of which is assigned to the same assignee as the present application, and U.S. Pat. Nos. 4,905,243, 5,978,391, 5,450, 207, 4,926,428, 5,748,346, 5,025,445, and 5,978,394, all of the above wavelength and/or bandwidth detection and monitoring components being hereby incorporated by reference.

Other components of the diagnostic module may include a pulse shape detector or ASE detector, such as are described at U.S. patent application Ser. Nos. 09/484,818 and 09/418, 052, respectively, each of which is assigned to the same assignee as the present application and is hereby incorporated by reference, such as for gas control and/or output beam energy stabilization. There may be a beam alignment monitor, e.g., such as is described at U.S. Pat. No. 6,014,206 which is hereby incorporated by reference.

The processor or control computer 16 receives and processes values of some of the pulse shape, energy, amplified spontaneous emission (ASE), energy stability, energy overshoot for burst mode operation, wavelength, spectral purity and/or bandwidth, among other input or output parameters of the laser system and output beam. The processor 16 also controls the line narrowing module to tune the wavelength and/or bandwidth or spectral purity, and controls the power supply and pulser module 4 and 8 to control preferably the moving average pulse power or energy, such that the energy dose at points on the workpiece is stabilized around a desired value. In addition, the computer 16 controls the gas handling module 6 which includes gas supply valves connected to various gas sources.

The laser gas mixture is initially filled into the laser chamber 2 during new fills. The gas composition for a very stable excimer laser in accord with the preferred embodiment uses helium or neon or a mixture of helium and neon as buffer gas, depending on the laser. Preferred gas composition are described at U.S. Pat. Nos. 4,393,405 and 4,977, 573 and U.S. patent application Ser. Nos. 09/317,526, 09/513,025, 60/124,785, 09/418,052, 60/159,525 and 60/160,126, each of which is assigned to the same assignee and is hereby incorporated by reference into the present application. The concentration of the fluorine in the gas mixture may range from 0.003% to 1.00%, and is preferably around 0.1%. An additional gas additive, such as a rare gas, may be added for increased energy stability and/or as an attenuator as described in the '025 application, mentioned above. Specifically, for the F2-laser, an addition of Xenon and/or Argon may be used. The concentration of xenon or argon in the mixture may range from 0.0001% to 0.1%. For an ArF-laser, an addition of xenon or krypton may be used also having a concentration between 0.0001% to 0.1%.

Halogen and rare gas injections, total pressure adjustments and gas replacement procedures are performed using the gas handling module 6 preferably including a vacuum pump, a valve network and one or more gas compartments. The gas handling module 6 receives gas via gas lines connected to gas containers, tanks, canisters and/or bottles. Preferred gas handling and/or replenishment procedures of the preferred embodiment, other than as specifically described herein, are described at U.S. Pat. Nos. 4,977,573 and 5,396,514 and U.S. patent application Ser. Nos. 60/124, 785, 09/418,052, 09/379,034, 60/171,717, and 60/159,525, each of which is assigned to the same assignee as the present application, and U.S. Pat. Nos. 5,978,406, 6,014,398 and 6,028,880, all of which are hereby incorporated by reference. A Xe gas supply may be included either internal or external to the laser system according to the '025 application, mentioned above.

Figure 2:
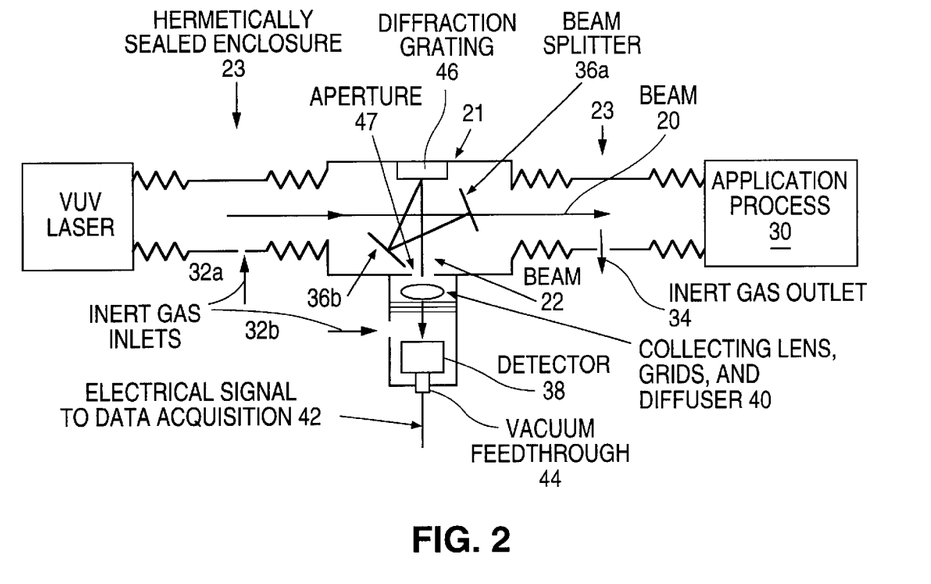
FIG. 2 schematically illustrates a beam path enclosure in accord with a first preferred embodiment.

Referring now to FIG. 2, a first preferred embodiment of a beam delivery system includes the enclosure 23, mentioned briefly above, which seals the beam paths of the beams 20 and 22 everywhere after the beam is outcoupled from the laser system until the beam 20 reaches the application process 30. The enclosure 23 is maintained substantially free of VUV photoabsorbing species such as water vapor, oxygen, hydrocarbons and fluorocarbons preferably by a method as set forth at U.S. patent application Ser. No. 09/343,333, incorporated by reference above.

Briefly, the preferred method, as described in more detail in the '333 application, is a method wherein the enclosure 23 is first pumped down to a rough vacuum, e.g., using a mechanical roughing pump, such as a rotary vane pump. Next, an inert gas is purged into the enclosure 23. The vacuum/purging steps are preferably performed some optimal number of times, such as from one to ten times, balancing the removal of photoabsorbing impurities in the enclosure 23 with the time it takes to perform those steps. Then, an inert gas is flowed at a slight overpressure (e.g., <50 mbar) using gas inlets 32a and 32b and gas outlet 34. The VUV laser is operated with the inert gas flowing at the slight overpressure. The above method is preferred as being time and cost efficient. Two alternative methods which may, however, be used for keeping the beam path substantially free of photoabsorbing species are pumping the enclosure 23 to high vacuum, and flowing an inert gas at high flow rate through the enclosure 23.

The application process 30 may include a separate housing for the workpiece and/or additional optical equipment such as an imaging system, or may be the workpiece itself. Two reflectors 36a and 36b, preferably both being beam splitters or one reflector 36a being a beam splitter and the other reflector 36b being a mirror, are shown for splitting off beam 22 and allowing the substantial portion of the beam 20 to pass through unhindered towards the application process 30. The beam 22 is directed ultimately to the detector 38, preferably via a collecting lens, grids and a diffuser (collectively 40), and a signal 42 corresponding to the energy measured is sent to a processor (not shown) or other data acquisition equipment using a vacuum feedthrough 44. A visible red light portion of the beam 22 is preferably first filtered such that substantially only the VUV portion of the beam 22 reaches the detector 38, as described in more detail below.

The reflectors 36a and 36b preferably each comprise uncoated plates made of excimer grade $CaF_2$, $MgF_2$ quartz, fused silica, doped fused silica, LiF, $BaF_2$, or other material that is mostly transparent to VUV radiation. In this case, the reflectivity of each reflector 36a and 36b is preferably approximately 3–15%, e.g., 8%. Additional dielectric coatings can be deposited onto preferred reflectors 36a and 36b in order to reduce or increase reflectivity. However, uncoated surfaces allow the preferred reflectors 36a and 36b to have longer lifetimes than those with coated surfaces.

The incidence angles of the beam onto the preferred reflectors 36a and 36b are preferably relatively small, in order to reduce the dependence of the reflectivity on the polarization of the incident laser beam, as explained below. The reflectivity of the uncoated surface for p- and s-polarized beams is described by Fresnel's formulas:

$$R_s = \sin^2(\phi - \phi')/\sin^2(\phi + \phi'),$$

$$R_p = \tan^2(\phi - \phi')/\tan^2(\phi + \phi'),$$

where incident and refracted angles $\phi$ and $\phi'$ are approximately related through the formula:

$$\sin(\phi) = n \cdot \sin(\phi'),$$

where n is the refractive index of the material.

Thus, for the angles that approach Brewster's angle $\phi_B = \arctan(n)$, the reflectivity of the p-component decreases to zero, while s-components experience an increase in reflectivity. For example, for materials such as $CaF_2$ or $MgF_2$ with refractive indices of approximately 1.5, Brewster's angle $\phi_B$ is approximately 56°. At 45° incidence, the ratio of reflectivities for s- and p-polarized beams is still as high as 10.5. One should preferably avoid such contrast since in the case of p-polarized laser output, small changes of polarization state can cause large errors in energy readings. Therefore, the incidence angles are preferably limited to less than 22.5°.

The reflectors 36a and 36b direct the beam 22 at an appropriate angle to the diffraction grating 46. The grating 46 shown is a reflection grating 46. An alternative configuration may include a transmission grating. A grism may also alternatively be used preferably made of $CaF_2$ or another of the VUV transparent materials set forth above.

The grating 46 provides separation of the VUV beam from the red portion of the beam 22. The incidence and reflection angles $\theta_i$ and $\theta_r$ into/from the diffraction grating 46 are related through the formula:

$$\sin(\theta_i) - \sin(\theta_r) = m\lambda/d$$

where $\lambda$ is the wavelength, m is diffraction order (m=0, +/−1, +/−2 . . . ) and d is the periodic spacing of the grooves of the grating. For example, a typical grating with the groove density of 1200 grooves/mm and an incidence angle of 11°, zeroth- and first-order reflected beams at 157 nm will be at −11° and zero°, respectively. At the same time, the nearest angles of reflection for the red light of the wavelength of approximately 700 nm will be around −11° and 40.5° for zeroth- and -first orders, respectively. Thereafter, one can separate the VUV and red portions of the beam 22 by using an aperture in front of the detector as shown in FIG. 2, 4, 5 or 6.

Collecting lens and diffuser, of the assembly 40 which also includes grids, described below, should be preferably made of one of the materials mentioned above as a choice for preferred beam-splitters 36a and 36b. The diffuser serves to attenuate the beam and also to decrease dependence of the overall sensitivity on the beam alignment. The attenuator grids are preferably fine-pitch stainless steel meshes. These serve as additional diffusers and attenuators, and additionally provide shielding of the detector against electromagnetic interference. Additional beam shaping optics, such as an aperture 47, may be includes, e.g., as set forth at U.S. patent application No. 60/172,749, which is assigned to the same assignee and is hereby incorporated by reference.

Preferably, optical components 40 and detector 38 are encased into the enclosure 23, as shown, or in a separately hermetically sealed housing with inert gas purging, having an entrance window for the beam 22. It has been observed that when such enclosure is evacuated, there tends to occur a build-up of hydrocarbon film on the optical elements exposed to the UV beam. This is likely caused by polymerization of organic molecules present in low-grade vacuum. Instead of providing high-vacuum enclosure, it is preferred to arrange purging, as described above (see the '333 application) with clean inert gas (such as nitrogen, helium, argon, neon and others) at a flow rate preferably around 5 liters/min or less.

Figure 3:
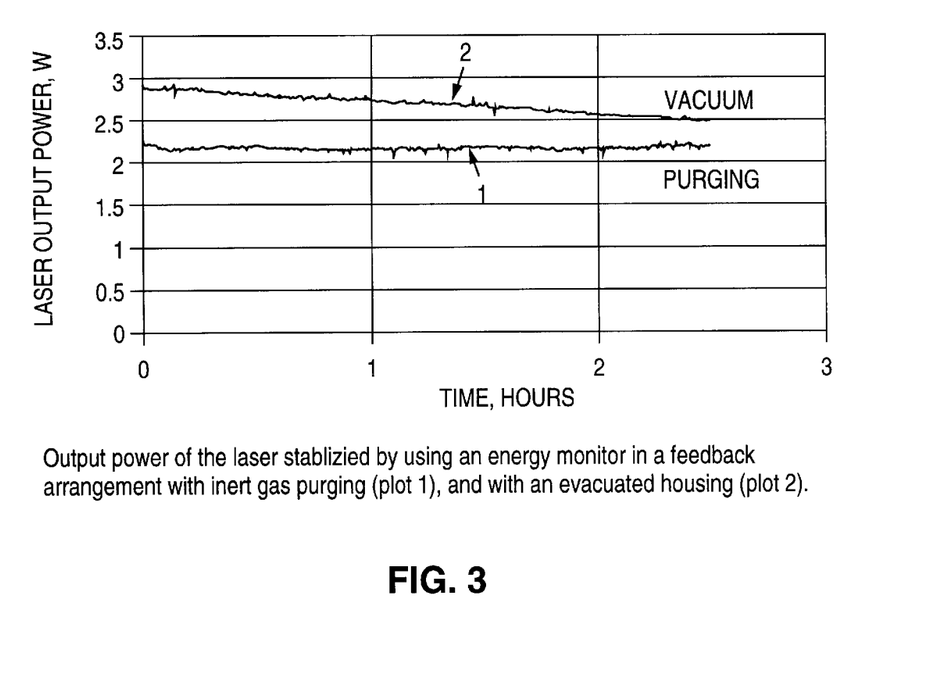
FIG. 3 shows plots of measured laser output power versus time for a molecular fluorine laser system including a beam path enclosure having an evacuated interior and an enclosure purged with a steady flow of inert gas in accord with a preferred embodiment.

Experimentally, it has been observed that purging improves stability of the laser output by at least an order of magnitude, as shown in FIG. 3. FIG. 3 shows the output power of a laser in accord with the preferred embodiment of FIGS. 1 and 2. Plot 1 shows the output power when inert gas purging is used, and plot 2 shows the output power when an evacuated housing is used. Plot 1 shows the output power stabilized around 2.2 W over about 2.5 hours, while plot 2 shows the output power decreasing from around 2.8 W to around 2.5 W over the same period. Thus the energy stability observed with inert gas purging is far better than with an evacuated housing.

The gas flow path is also preferably arranged in such a way as to minimize or avoid any "dead", un-purged spaces in the enclosure 23 of FIG. 2. For example, an additional gas inlet 32b is preferably provided as shown in FIG. 2 to the chamber encasing the detector and separated from the main beam path by grid attenuators. The collecting lens and diffuser are preferably mounted so that there are vent holes around them. Among mentioned above inert gases, it is preferred to use ultra-high purity argon, for the reason of its relatively low cost, as compared to helium and neon. Nitrogen of ultra-high purity grade typically contains higher levels of impurities as compared to UHP-helium and neon and, therefore, is less suitable for purging.

The detector 38 may be one of, but is not limited to, a silicon photodiode, pyroelectric, thermopile, electron phototube, photomultiplier, CCD-detector, or diamond detector as set forth in U.S. patent application No. 60/122, 145, which is assigned to the same assignee as is hereby incorporated by reference. Preference is based on the lifetime, sensitivity, time resolution and cost.

The diffraction grating 46 is preferably aluminum-coated and protected with the thin layer of $MgF_2$, and may be otherwise as may be known to one skilled in the art of UV diffraction gratings. The grating may be one of those described at U.S. patent application No. 60/167,835, which is assigned to the same assignee, and U.S. Pat. No. 5,999, 318, each of which is hereby incorporated by reference. Sides of the grating should be carefully protected from stray UV light by appropriate shields, for example made of aluminum foil. The purpose of the shields is to prevent degradation and outgassing of organic materials beneath the aluminum layer which are commonly used in the process of replication of gratings.

Figure 4:
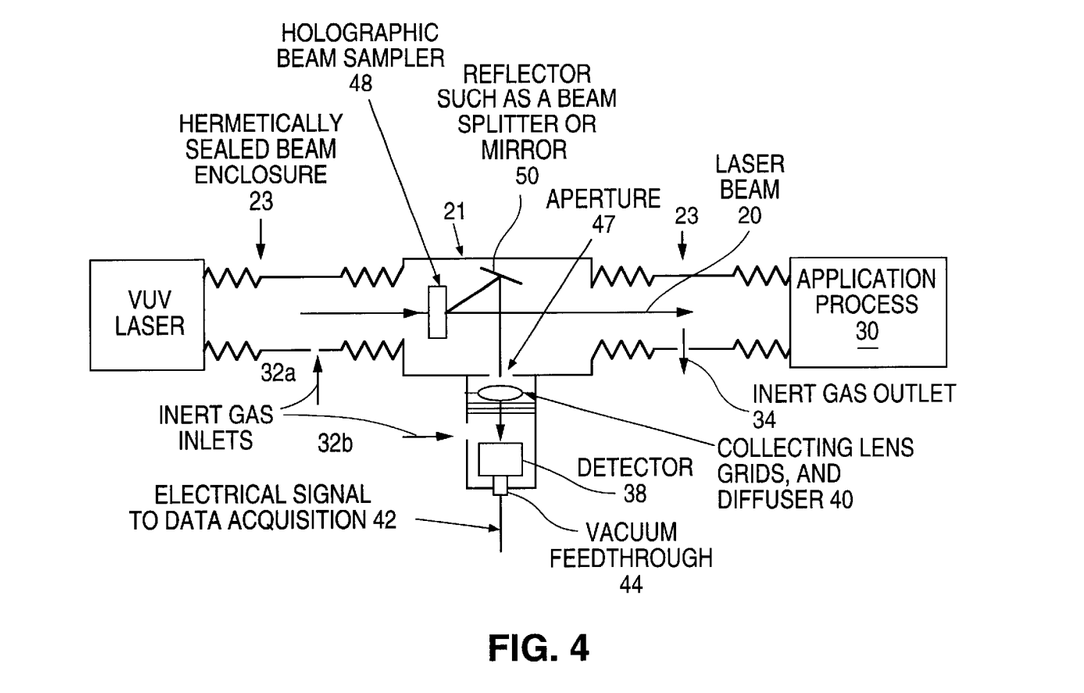
FIG. 4 schematically illustrates a beam path enclosure in accord with a second preferred embodiment.

Referring to FIG. 4, the second embodiment is preferably the same or similar to the first embodiment shown and described with respect to FIG. 2, except that the second embodiment shown at FIG. 4 utilizes a holographic beam sampler 48 (for example: HBS-series from Gentec Electro-optics, Sainte-Foy, Quebec, Canada). Holographic beam sampler 48 is preferably a transmissive diffraction grating formed on a transparent substrate (see above for the choice of materials transparent in the VUV range). Advantages of the holographic beam sampler 48 include: (1) only very small portion of the beam energy is split off (typically ~0.1%), therefore, insertion losses are very low, e.g., as compared to ~8% for conventional beam-splitter, and (2) wavelength separation is achieved at the same time, since the diffraction angle for the red portion of the beam is different from that of the VUV component, thus making the design simple and robust. A disadvantage of the holographic sampler 48 however, is its higher cost. The choice of preferred materials for the diffractive beam sampler is dictated by its transparency in VUV range and radiation hardness. Examples of such materials are $CaF_2$, $MgF_2$, quartz, fused silica, doped fused silica, LiF, $BaF_2$.

The VUV portion of the beam 20 that is diffracted at the holographic beam sampler 48 is directed to a reflector 50 such as a VUV mirror or beamsplitter. The reflector directs the VUV light toward the assembly 40 and detector 38 The reflector 50 is designed for maximum reflectance at VUV wavelengths. The reflector 50 may be at least partly transmissive at visible wavelengths to prevent or minimize red light reflection towards the detector. A copper shield may be provided around the reflector 50 to absorb this red light, e.g., so that the red light is not otherwise reflected within the enclosure towards the detector 38. An example of such an arrangement of the reflector 50 is described at U.S. patent application No. 60/166,952, which is assigned to the same assignee and is hereby incorporated by reference.

Figure 5:
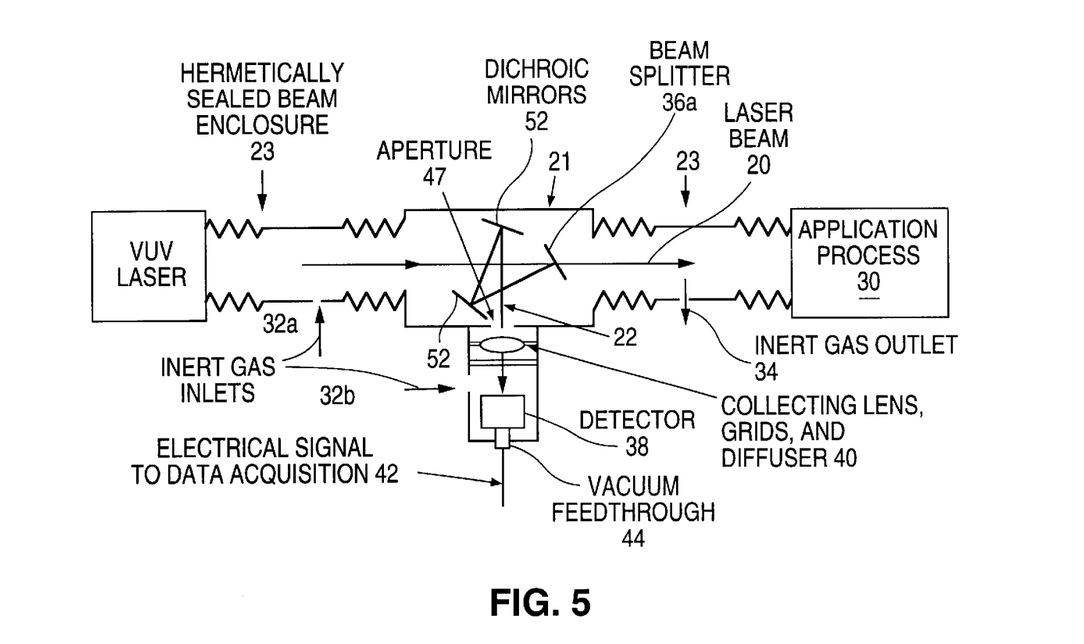
FIG. 5 schematically illustrates a beam path enclosure in accord with a third preferred embodiment.

Referring to FIG. 5, the third embodiment is the same or similar to that shown and described with respect to the first embodiment of FIG. 2, except that the third embodiment of FIG. 5 utilizes dichroic dielectric mirrors 52 in order to achieve separation of the VUV beam from the red portion of the laser output. In the third embodiment shown in FIG. 5, one beam-splitter 36a and two dichroic mirrors 52 are preferably used. The dichroic mirrors 52 are preferably formed by depositing thin quarter-wave layers of dielectrics with alternating high and low refractive index, so that VUV beam is mostly reflected and red light is almost completely transmitted. Other details of dichroic mirrors 52 are understood by those skilled in the art. Typically, a contrast ratio between the reflectance of the VUV light and the red light of better than 30 can be achieved. The choice of the number of mirrors is determined by the suppression ratio desired for reducing the signal caused by the red component, e.g., below 1.0% or less. Two mirrors will typically provide at least two orders of magnitude contrast ratio.

Figure 6:
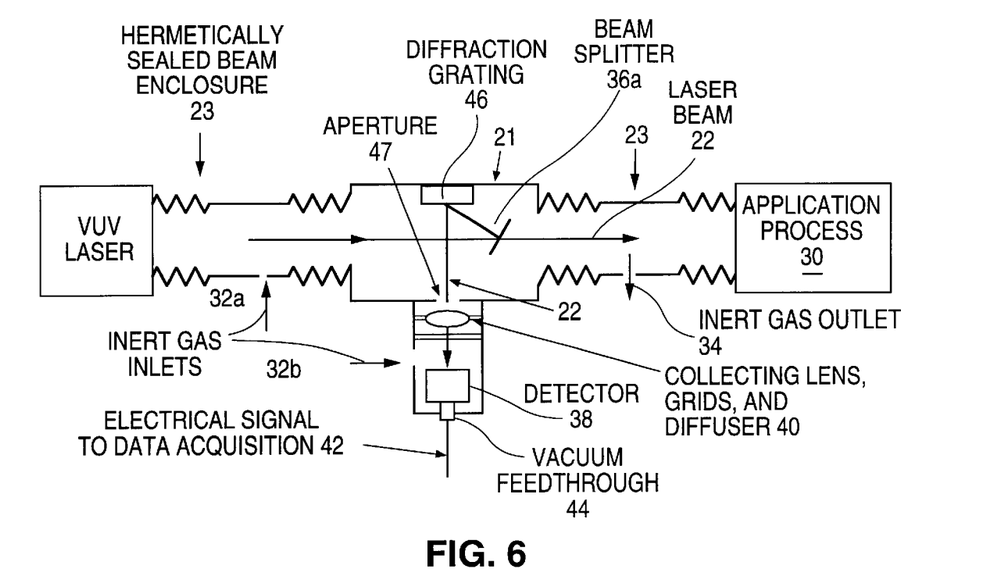
FIG. 6 schematically illustrates a beam path enclosure in accord with a fourth preferred embodiment.

Referring to FIG. 6, the fourth embodiment is an alternative variation of the first embodiment, and as such, is the same as or similar to the first embodiment of FIG. 2, except that the fourth embodiment of FIG. 6 includes only one beam splitter 36a and a grating 46. In the arrangement of FIG. 6, the intensity of the optical signal to the detector 38 is increased compared to the first embodiment of FIG. 2. This may be desired if the sensitivity of the detector 38 is otherwise insufficient at a given output power of the laser. Alternatively, three or more beamsplitters 36a, 36b, 36c, etc., can be employed, with the advantage is some circumstances that a reduction in signal to the detector 38 may be achieved. In doing so, an advantage of reducing the intensity of the beam at the diffraction grating 46, and the assembly 40, particularly including the collecting lens and attenuator grids, is that the lifetimes of these components may be increased. At the same time, decreasing in the intensity of the beam sample can lead to a lower signal-to-noise ratio if the noise is dominated by scattered light inside the housing of the energy detector 38. Therefore, depending on the output power of the VUV laser and sensitivity of the detector 38, there is some optimum number of the beamsplitters 36a, etc. that may be selected. These considerations apply to the second and third embodiment as well as to the first embodiment.

Figure 7A:
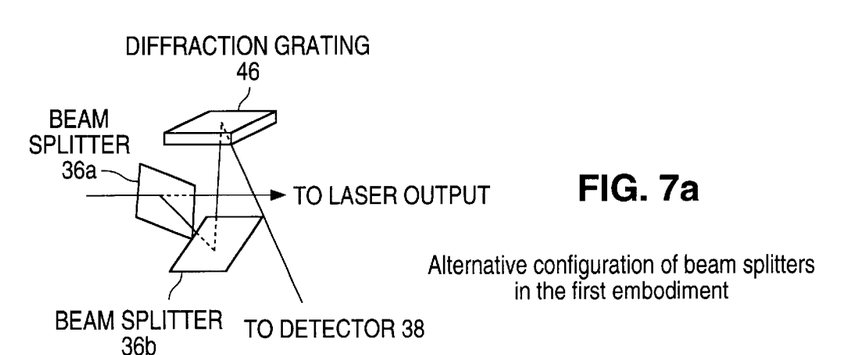
FIGS. 7a and 7b schematically illustrate alternative beam splitter configurations to the first and third preferred embodiments of FIGS. 2 and 5, respectively.
Figure 7B:
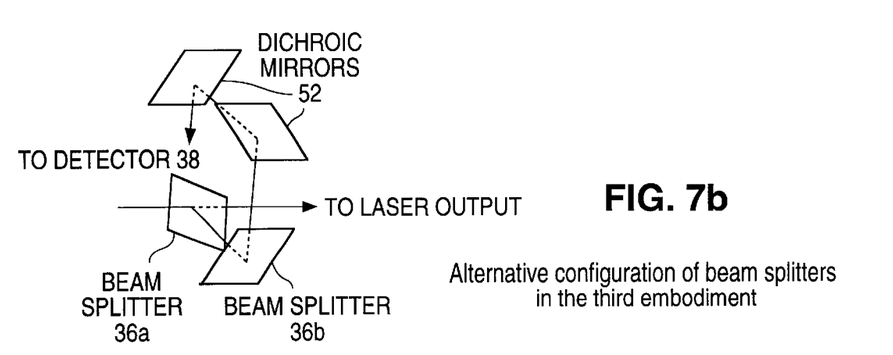

FIGS. 7a and 7b show alternative arrangements of beam-splitters that can be utilized in the first and third embodiments, respectively, preferably when the laser output is polarized. In both FIG. 7a and FIG. 7b, two reflectors 36a and 36b, preferably both beamsplitters, are used. The reflectors 36a and 36b are aligned to eliminate deviations due to polarization fluctuations and preferences based on differing reflectivities for the orthogonal polarization components.

Generally, the first beam splitter 36a and the second reflector 36b are aligned so that the polarization dependence of the reflectivity of the first beam splitter 36a is compensated by the polarization dependence of the reflectivity of the second reflector 36b. For example, the first beam splitter 36a may be aligned to reflect the p-polarization component of the incident beam at 10% of the efficiency of the s-polarization component. The second reflector 36b is then aligned to reflect the component corresponding to the s-polarization component incident at the first beam splitter 36a at 10% of the efficiency of its orthogonal counterpart corresponding to the p-polarization component incident at the first beam splitter 36a. Thus, the overall dependence on the polarization of the output beam of the reflectivity of the first beam splitter 36a-second reflector 36b combination is reduced or eliminated.

Preferably, the first reflector 36a of both FIGS. 7a and 7b is oriented in such a way that in the case that the incident laser beam is polarized, the beam is p-polarized with respect to this first beam-splitter 36a. The second reflector 36b of both FIGS. 7a and 7b is preferably oriented in a perpendicular plane to the first reflector 36a, so that the p-component of laser beam reflected from the first reflector 36a is s-polarized with respect to the second reflector 36b. Preferably, each reflector 36a and 36b reflects the beam at an incidence angle of substantially 45 degrees.

An additional advantage of this configuration of the reflectors 36a and 36b of both FIGS. 7a and 7b is that the reflectivity of the first reflector 36a for a polarized laser beam is significantly reduced, typically from about 4% to 0.1%. Therefore, more of the beam power is available for the application. At the same time, the above explained advantage of polarization selectivity of the first reflector 36a is compensated by the inverse selectivity of the second reflector 36b, since p- and s-components of the incident beam become s- and p-components, respectively, at the second reflector 36b.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, the steps have been ordered in selected typographical sequences. However, the sequences have been selected and so ordered for typographical convenience and are not intended to imply any particular order for performing the steps, except for those claims wherein a particular ordering of steps is expressly set forth or understood by one of ordinary skill in the art as being necessary.

What is claimed is:

1. A method of delivering a VUV laser light portion from a main beam which is generated by a VUV laser to a detector for monitoring a parameter of the beam, comprising the steps of:

sealing off a beam path of the VUV laser light portion within an enclosure optically coupled with the detector;

preparing the interior of the enclosure for transmitting the main beam and VUV light portion for delivery to the detector such that said interior is substantially free of VUV photoabsorbing species, and wherein said VUV light portion that is delivered to the detector is directed along a beam path within said enclosure and is thereby protected from being substantially attenuated by said VUV photoabsorbing species;

separating said VUV light portion for delivery to the detector from the main beam; and detecting the VUV light portion separated from said main beam at said separating step and substantially delivered to the detector along said beam path.

2. The method of claim 1, wherein said VUV laser is a molecular fluorine laser, said method further comprising the step of filtering a red beam portion from said VUV light portion.

3. The method of claim 2, wherein said filtering step is performed after said separating step.

4. The method of claim 2, wherein said filtering step includes dispersing the red beam portion from the VUV light portion.

5. The method of claim 2, wherein said filtering step includes reflecting the VUV light portion while transmitting the red beam portion using a dichroic mirror.

6. The method of claim 2, wherein said filtering and separating steps further include at least one step selected from the group of steps consisting of performing said filtering step and said separating step simultaneously, dispersing the beam, and holographically sampling the beam.

7. The method of claim 6, further comprising the step of redirecting the VUV light portion to the detector after said filtering step.

8. The method of claim 2, wherein said preparing step includes flowing an inert gas through said enclosure.

9. The method of claim 8, wherein said preparing step further includes evacuating said enclosure prior to said inert gas flowing step.

10. The method of claim 9, wherein said evacuating and flowing steps are performed a plurality of times, with a final flowing step being performed and maintained during operation of the VUV laser.

11. The method of claim 10, further comprising the step of redirecting the VUV light portion to the detector after the separating step.

12. The method of claim 2, wherein detecting step is performed after said separating and filtering steps.

13. A method of delivering a laser beam which is generated by an excimer or molecular fluorine laser to an application process, comprising the steps of:

sealing off a beam path of the laser beam within an enclosure;

disposing at least one optical component within said enclosure;

preparing an interior of the enclosure for transmitting the laser beam such that said interior is substantially free of contaminant species, and wherein said beam is directed along a beam path within said enclosure and is thereby protected from being substantially disturbed by said contaminant species; and interacting said beam with said at least one optical component within said enclosure, wherein said beam is thereby directed along said beam path within said enclosure and substantially delivered through said at least one optical component to the application process.

14. The method of claim 13, wherein said at least one optical component includes a diffraction grating.

15. The method of claim 14, wherein said interacting step includes the step of dispersing said beam such that only a selected portion of a spectral distribution of said beam continues to propagate along said beam path and other portions of said spectral distribution of said beam are dispersed away from said beam path.

* * * * *